(12) United States Patent
Chang et al.

(10) Patent No.: US 9,263,550 B2
(45) Date of Patent: Feb. 16, 2016

(54) GATE TO DIFFUSION LOCAL INTERCONNECT SCHEME USING SELECTIVE REPLACEMENT GATE FLOW

(71) Applicant: International Business Machines Corporation, Armonk, NY (US)

(72) Inventors: Josephine B. Chang, Mahopac, NY (US); Michael A. Guillorn, Yorktown Heights, NY (US); Isaac Lauer, Yorktown Heights, NY (US); Jeffrey W. Sleight, Ridgefield, CT (US)

(73) Assignee: International Business Machines Corporation, Armonk, NY (US)

(*) Notice: Subject to any disclaimer, the term of this patent is extended or adjusted under 35 U.S.C. 154(b) by 34 days.

(21) Appl. No.: 14/255,440

(22) Filed: Apr. 17, 2014

(65) Prior Publication Data

US 2015/0303277 A1    Oct. 22, 2015

(51) Int. Cl.

| H01L 21/76 | (2006.01) |
|---|---|
| H01L 29/66 | (2006.01) |
| H01L 21/763 | (2006.01) |
| H01L 29/423 | (2006.01) |
| H01L 29/78 | (2006.01) |

(52) U.S. Cl.
CPC ........ *H01L 29/66545* (2013.01); *H01L 21/763* (2013.01); *H01L 29/4236* (2013.01); *H01L 29/66484* (2013.01); *H01L 29/66795* (2013.01); *H01L 29/785* (2013.01); *H01L 29/7831* (2013.01)

(58) Field of Classification Search
None
See application file for complete search history.

(56) References Cited

U.S. PATENT DOCUMENTS

| 5,064,776 | A  | 11/1991 | Roberts |
| 5,206,532 | A  | 4/1993  | Roberts |
| 5,641,694 | A  | 6/1997  | Kenney |
| 6,100,185 | A  | 8/2000  | Hu |
| 6,703,668 | B1 | 3/2004  | Lin et al. |
| 6,856,031 | B1 | 2/2005  | Nguyen et al. |
| 7,015,552 | B2 | 3/2006  | Ye et al. |
| 8,368,219 | B2 | 2/2013  | Halliyal et al. |
| 8,466,052 | B2 | 6/2013  | Baek et al. |

*Primary Examiner* — Sonya D McCall Shepard
(74) *Attorney, Agent, or Firm* — Louis J. Percello; Michael J. Chang, LLC (57) ABSTRACT

A method of fabricating a device is provided which includes selectively implanting one or more dopants into a semiconductor wafer so as to form doped and undoped regions of the wafer; forming fins in the wafer with at least a given one of the fins being formed both from a portion of the doped region of the wafer and from a portion of the undoped region of the wafer; forming dummy gates on the wafer; depositing a filler layer around the dummy gates; removing the dummy gates forming trenches in the filler layer, at least one of which extends down to the undoped portion of the fin and at least another of which extends down to the doped portion of the fin; selectively forming a gate dielectric lining the trenches which extend down to the undoped portion of the fin; and forming replacement gates in the trenches.

13 Claims, 6 Drawing Sheets

Cross-section A-A'

FIG. 5

Cross-section A-A'

GATE TO DIFFUSION LOCAL INTERCONNECT SCHEME USING SELECTIVE REPLACEMENT GATE FLOW

FIELD OF THE INVENTION

The present invention relates to local interconnect formation in a replacement gate process flow, and more particularly, to scalable gate to diffusion local interconnect formation techniques which eliminate the need for gate to diffusion crossover contacts.

BACKGROUND OF THE INVENTION

Local interconnect structures are used to electrically connect different transistors fabricated on a common substrate. Typically, first and second metallization layers are used to make these electrical contacts between certain regions of the wafer. However, with nanowire devices, this significantly limits density scaling since one is limited by middle-of-line (MOL) wiring density and not by active nanowire density.

Specifically, the first and second metallization layers seriously limit the density of integrated circuits. For instance, metal layers are often used to connect gates in a cross couple configuration which significantly limits density scaling due to constraints on first metal layer patterning.

Hence, a need exists to solve the local interconnect density problem to insure continuous scaling.

SUMMARY OF THE INVENTION

The present invention provides techniques for local interconnect formation in a replacement gate process flow. In one aspect of the invention, a method of fabricating a device is provided which includes the steps of: selectively implanting one or more dopants into a semiconductor wafer so as to form at least one doped region of the wafer at least one undoped region of the wafer; forming fins in the wafer with at least a given one of the fins being formed both from a portion of the doped region of the wafer and from a portion of the undoped region of the wafer, such that the at least one given fin comprises both a doped portion and an undoped portion; forming dummy gates on the wafer, wherein one or more of the dummy gates are in contact with the undoped portion of the at least one given fin and one or more other of the dummy gates are in contact with the doped portion of the at least one given fin; depositing a filler layer around the dummy gates; removing the dummy gates selective to the filler layer forming trenches in the filler layer, wherein at least one of the trenches extends through the filler layer down to the undoped portion of the at least one given fin and at least one other of the trenches extends through the filler layer down to the doped portion of the at least one given fin; selectively forming a gate dielectric lining the trenches which extend through the filler layer down to the undoped portion of the at least one given fin; and forming replacement gates in the trenches, wherein i) the replacement gates formed in the trenches which extend through the filler layer down to the undoped portion of the at least one given fin are separated from the undoped portion of the at least one given fin by the gate dielectric and ii) the replacement gates formed in the trenches which extend through the filler layer down to the doped portion of the at least one given fin are in direct contact with the doped portion of the at least one given fin.

In another aspect of the invention, a device is provided which includes a semiconductor wafer having at least one doped region and at least one undoped region; fins formed in the wafer with at least a given one of the fins being formed both from a portion of the doped region of the wafer and from a portion of the undoped region of the wafer, such that the at least one given fin comprises both a doped portion and an undoped portion; a filler layer on the wafer, wherein the filler layer has trenches therein, and wherein at least one of the trenches extends through the filler layer down to the undoped portion of the at least one given fin and at least one other of the trenches extends through the filler layer down to the doped portion of the at least one given fin; a gate dielectric lining only the trenches which extend through the filler layer down to the undoped portion of the at least one given fin; and gates formed in the trenches, wherein i) the gates formed in the trenches which extend through the filler layer down to the undoped portion of the at least one given fin are separated from the undoped portion of the at least one given fin by the gate dielectric and ii) the gates formed in the trenches which extend through the filler layer down to the doped portion of the at least one given fin are in direct contact with the doped portion of the at least one given fin.

A more complete understanding of the present invention, as well as further features and advantages of the present invention, will be obtained by reference to the following detailed description and drawings.

DETAILED DESCRIPTION OF PREFERRED EMBODIMENTS

The present techniques address the limitations imposed on device density scaling by conventional metallization processes. As will be described in detail below, the present techniques employ a selective replacement metal gate (RMG) process, where some of the devices are normal gated field-effect transistor (FET) structures, whereas other 'devices' are actually direct shunts from the gate formed by intentional removal of the gate dielectric in these 'devices.' This enables a connection from the gate line to a diffusion line without the use of any explicit contact and/or metal. This process can be employed in a variety of different device configurations, including but not limited to, nanowire first or last devices, FIN field-effect transistor (FET) (FINFET) FIN first or last devices and/or planar complementary metal-oxide semiconductor (CMOS) devices.

Figure 1:
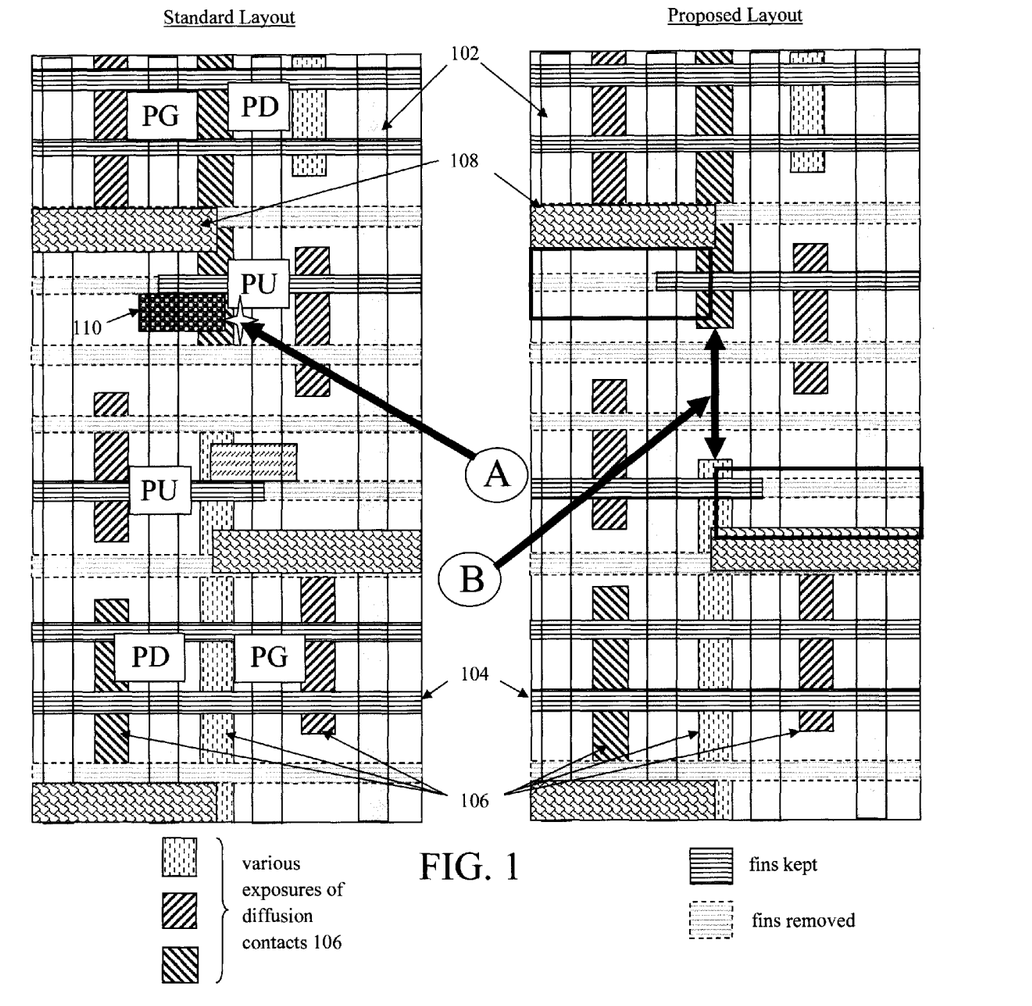
FIG. 1 is a diagram providing an overview, and illustrating the advantages, of the present techniques according to an embodiment of the present invention.

The present techniques will now be described in detail by way of reference to FIGS. 1-7. FIG. 1 first provides an overview of the present techniques. For comparison purposes, a standard static random access memory (SRAM) circuit layout is provided on the left side of FIG. 1 and the present SRAM circuit design is provided on the right side of FIG. 1. Each layout includes gates 102, fins 104, diffusion contacts to source and drain regions 106, and gate contacts 108. PU, PD, and PG refer to pull up, pull down, and pass gate devices, respectively. As is standard practice during FIN FET SRAM circuit fabrication, multiple fins are patterned, and one or more of which (or portions thereof) are subsequently removed. As shown in FIG. 1, the fins (or portions thereof) with bold hatching are those that remain (are kept), while those with gray hatching have been removed.

The spacing between the diffusion contacts 106 is important, and is one of the smallest spaces in the technology. Thus, the diffusion contacts 106 are often printed in multiple exposures. Accordingly, in FIG. 1, the diffusion contacts 106 resulting from different exposures are given different hatching patterns. In the example illustrated in FIG. 1, three different exposures are used to produce the diffusion contacts, hence three different hatching patterns are used. As will be described in detail below, by way of the present techniques, the end-to-end spacing of the diffusion contacts is increased. Thus, by relaxing this parameter, the number of diffusion contact exposures can be reduced.

Specifically, as shown in FIG. 1, in standard layouts crossovers 110 are used between the gates 102 and the diffusion contacts 106—providing a short between a specific gate 102 and diffusion contact 106. Crossovers 110 are, however, difficult to print and thus introduce the potential for errors, especially when feature sizes are reduced. Namely, when gate pitch is reduced (which is desired for device scaling purposes)—which essentially brings adjacent gates closer to one another—there is an increased risk of shorting to a neighboring gate via the crossover 110. See reference A to star in FIG. 1 which illustrates the potential for the crossover (which is hard to print accurately) to short adjacent gates, especially when the gate-to-gate spacing is reduced.

It is notable that when one decreases the gate pitch (bringing the gates closer to one another), one also decreases the diffusion end-to-end spacing (see FIG. 1, dimension given reference B). With conventional layouts, the diffusion placement needs to be controlled so as to line up with the crossovers 110. By comparison, as shown on the right in FIG. 1, with the present techniques, the crossovers are foregone thus enabling a greater end-to-end spacing (reference B) between adjacent diffusion contacts 106 since the diffusion contacts no longer need to line up with any crossovers. The ability to do without crossovers is attributable to the present circuit fabrication process wherein the gate dielectric is selectively removed in one or more devices thus permitting shunting between the respective gate and diffusion contact. Advantageously, this occurs without the use of an additional metal or contact as with the conventional crossover contact.

Figure 2:
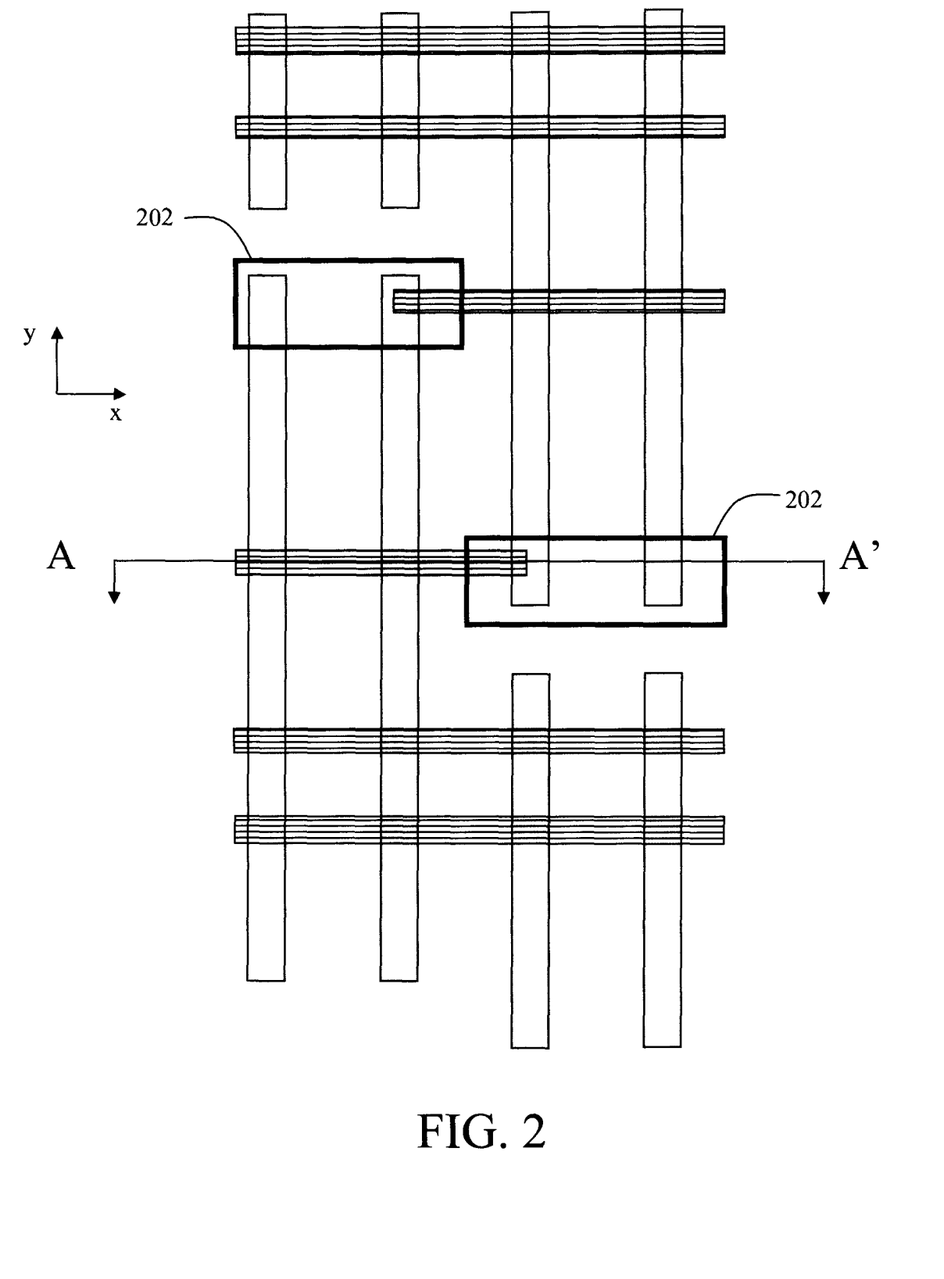
FIG. 2 is a diagram illustrating the regions of a circuit layout to which the present process is directed according to an embodiment of the present invention.

Namely, the present circuit fabrication flow employs a lithography-based process during fin and gate formation whereby the gate dielectric is selectively removed in some devices resulting in a gate(s) being shunted to a diffusion contact(s). FIG. 2 is a diagram which shows the present proposed layout (i.e., from the right-hand side of FIG. 1) with only the gates 102 and fins 104 shown to highlight the regions 202 of the devices to which this process is directed. In the figures that follow, the present fabrication process will be illustrated by way of cross-sectional cuts of the device along line A-A'. To understand what is happening in these regions 202, it is helpful to briefly refer to FIG. 8 which illustrates (by way of a cross-sectional view A-A') an end product of the process where one of the four gate lines (or simply "gates") shown in FIG. 2 is (in one of the regions 202) directly shunted to one of the diffusion regions. This shunting occurs based on the gate dielectric having been selectively removed from the two rightmost gates (including the shunted gate). Given this overview, the present device fabrication process is now described in detail by way of reference to FIGS. 3-8.

Figure 3:
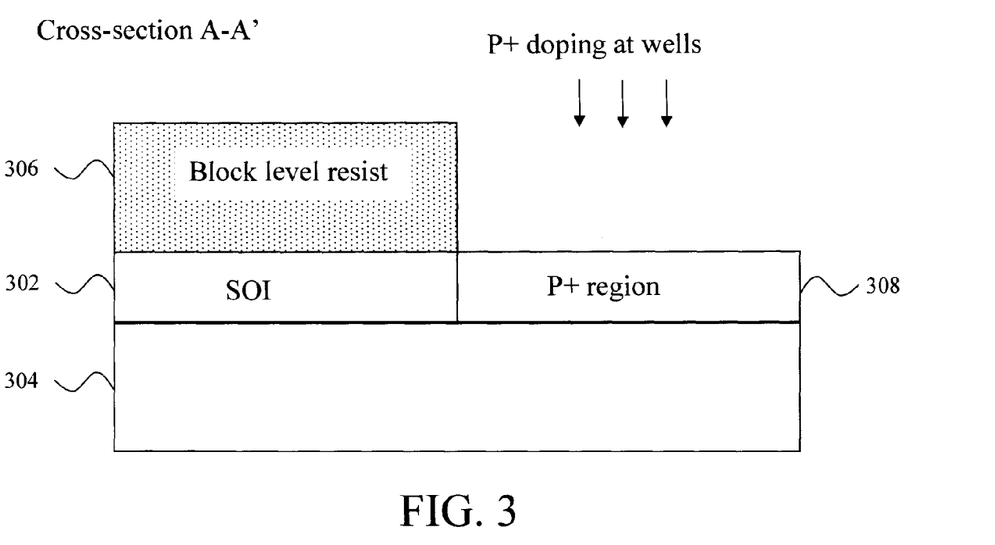
FIG. 3 is cross-sectional diagram illustrating a starting structure for the present circuit fabrication process including a silicon-on-insulator (SOI) layer having one or more doped regions according to an embodiment of the present invention.
Figure 4:
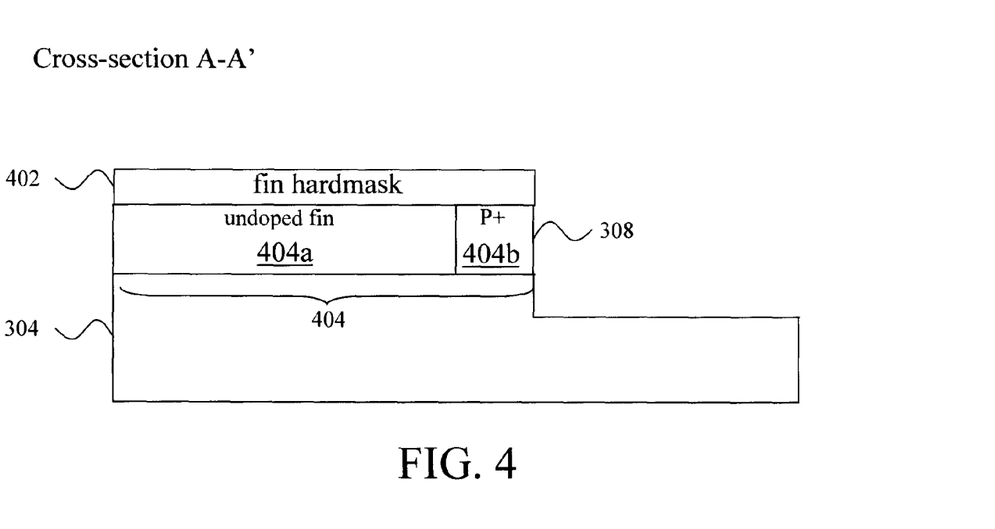
FIG. 4 is cross-sectional diagram illustrating one or more fins having been patterned in the SOI layer, wherein at least one of the fins patterned includes a doped portion formed from a doped region of the SOI layer according to an embodiment of the present invention.
Figure 8:
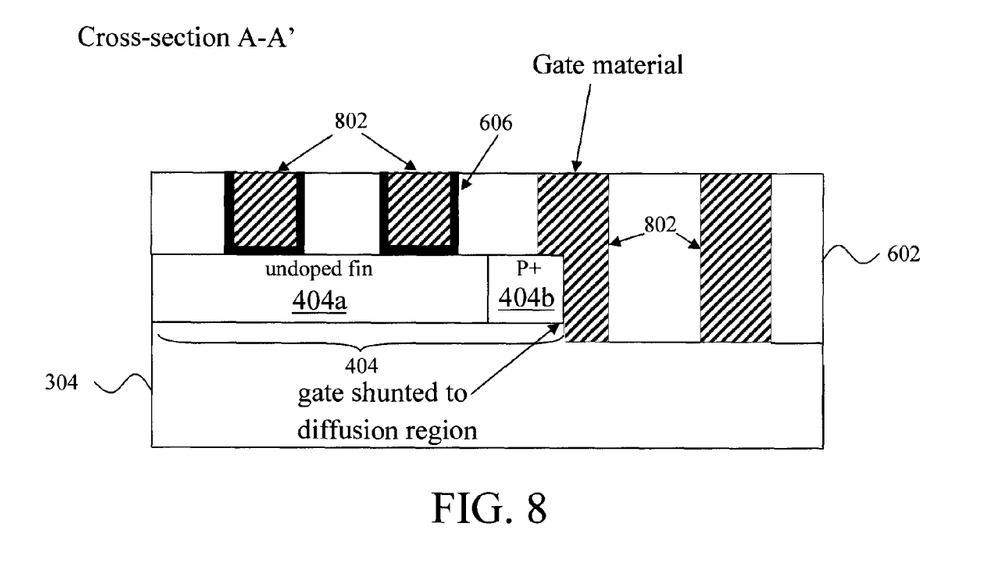
FIG. 8 is a cross-sectional diagram illustrating, after removal of the block level resist, a gate material having been deposited into the trenches to form (replacement) gates of the device, one or more of which are directly shunted to the doped portion(s) of the fins, and one or more others of which are separated from the undoped portion(s) of the fins by the gate dielectric according to an embodiment of the present invention.

FIG. 3 is a diagram illustrating a starting structure for the present device fabrication process. As provided above, FIGS. 3-8 will depict cross-sectional views through the circuit layout of FIG. 2 (along line A-A', i.e., through and parallel to one of the fins and perpendicular to the gates). It is notable that these structures, such as the fins, gates, etc. will be formed during the instant process and as such are not present in each depiction. For instance, in the starting structure shown FIG. 3, the fins and gates have not yet been formed. By way of reference only, fin patterning is shown in FIG. 4 and gate metal deposition is shown in FIG. 8.

As shown in FIG. 3, the starting structure in this example is a semiconductor-on-insulator (SOI) wafer. SOI wafers generally include a SOI layer 302 separated from a substrate (e.g., a silicon substrate) by a buried oxide (BOX) 304. For ease of depiction, the substrate is not shown in the figures. The SOI layer may include any suitable semiconductor material, such as silicon, germanium, etc. These particular wafer configurations are also often referred to specifically as silicon-on-insulator wafers, germanium-on-insulator wafers, etc. The use of an SOI wafer in this case is intended merely as one possible exemplary starting platform, and other substrates may be employed in the same manner, the implementation of which would be within the capabilities of one skilled in the art. For instance, one may choose to start with a bulk semiconductor (e.g., silicon, germanium, etc.) wafer.

A block level resist 306 is then formed on the SOI layer. The block level resist 306 will be used to mask those regions of the SOI layer 302 which will not be doped. Conversely, the regions of the SOI layer 302 not masked by the block level resist 306 (unmasked regions) will be doped. The block level resist 306 can be formed from any suitable resist material (e.g., polymer, polymer precursors, etc.) and may be processed using standard patterning techniques. Again by way of brief reference to FIG. 8 (an end product of the process), a comparison of FIG. 3 and FIG. 8 reveals that the block level resist 306 will be used to dope regions of the SOI that will be used to directly shunt one of the gate lines to a diffusion region(s).

Namely, a dopant(s) is/are then selectively implanted, using the block level resist 306 as a mask, into one or more regions 308 of the SOI layer 302 (also referred to hereinafter as doped regions 308). According to an exemplary embodiment, the regions 308 of the SOI layer are doped with a p-type dopant, such as boron (B). The block level resist 306 should be configured to mask those (undoped) regions of the SOI layer 302/fins which will be separated from the gates by a dielectric, and thus are not doped in this step. See, for example, FIG. 7.

Following the dopant implant, the block level resist 306 is then removed and fins are patterned in the SOI layer. See FIG. 4. It is notable that the order in which the steps of the process are presented is merely an example. For instance, the now-described process of patterning the fins may be carried out prior to the dopant implant. In either case, the fin patterning process is carried out using standard lithography and etching techniques wherein a fin hardmask 402 is first formed on the SOI layer and an etching process is used to pattern the fins through the hardmask.

However, one requirement specific to the present process is that the fin hardmask 402 should be configured such that the resulting fin(s) patterned in the region 202 (see FIG. 2) should be formed from both a portion of the doped region 308 and an (undoped) portion of the SOI layer 302. Thus, the resulting fin(s) (i.e., fin 404) will contain both an undoped portion 404*a* and a doped portion 404*b*. See FIG. 4. It is by way of this doped portion 404*b* of the fin that the respective gate will be directly shunted to the diffusion contact. Any portions of the fin hardmask 402 remaining after the fin etch may now be removed.

As shown in FIG. 4, it is possible that a top portion of the BOX 304 is etched during the fin etch. This depends on the etch selectivity between the SOI layer and the BOX. What is important is that the doped region(s) 308 is/are completely removed from over this area of the BOX so as to prevent shorting between the gates in that region (see, e.g., two right most gates in FIG. 8).

In this example, a replacement metal gate or RMG process is employed. As will be described in detail below, an RMG process allows for the selective removal of the gate dielectric from those devices for which shunting to the diffusion region is desired. In general, a RMG process involves first forming one or more 'dummy' gates which serve as placeholders for the (later-formed) actual gates of the device. Since the dummy gates are removed and replaced with the gates of the device, the final gates of the device are also referred to herein as 'replacement' gates. Further, in this example, the dummy gates are polysilicon and the replacement gates are metal gates (i.e., including a metal or a combination of metals). This is merely an example, and other configurations are of course possible. For instance, the replacement gates can be formed from other suitable gate materials, including, but not limited to doped polysilicon. As described below, the gates are separated from the fin channels by a dielectric (a gate dielectric), the composition of which can vary depending on the gate material chosen.

Thus, to begin the RMG process, one or more dummy gates 502 are formed. See FIG. 5. In this particular example, the dummy gates (which are patterned as gate lines) run perpendicular to the fins. Namely, by way of reference to FIG. 2 (described above), if the fins 404 are patterned such that they extend along a direction x on the surface of a wafer (one which the circuit is being formed), then the dummy gates 502 extend along a direction y on the surface of the wafer, wherein x and y are perpendicular to one another. See FIG. 2.

Figure 5:
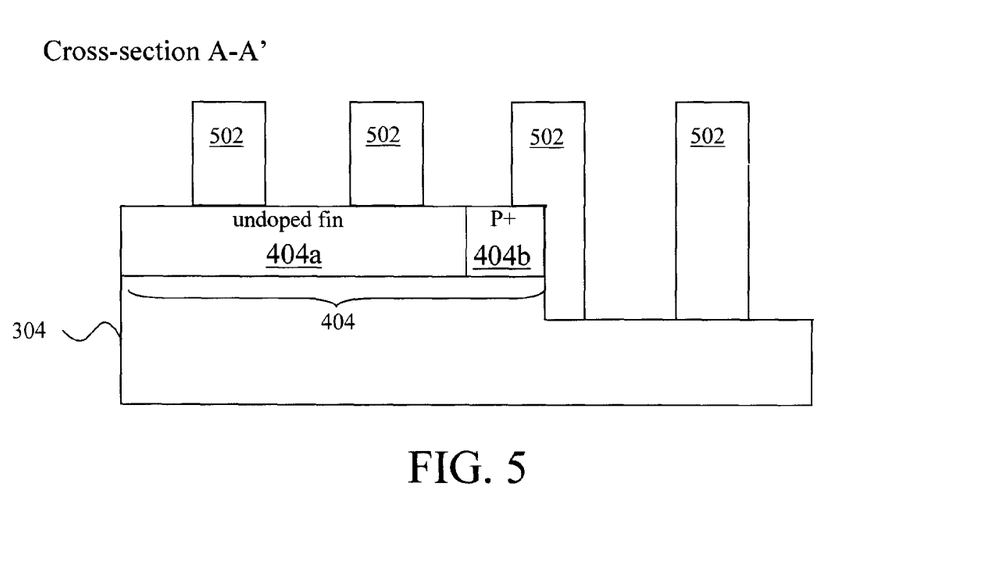
FIG. 5 is cross-sectional diagram illustrating one or more dummy gates having been formed over the fins according to an embodiment of the present invention.

By way of example only, the dummy gates 502 are formed by first blanket depositing a suitable dummy gate material (such as polysilicon) onto the wafer (for example using low pressure chemical vapor deposition (LPCVD)), and then patterning the material (for example using reactive ion etching (RIE) through a patterned resist mask) to form the dummy gates 502. As highlighted above, the dummy gates 502 serve as placeholders for the actual (replacement) gates of the device. According to an exemplary embodiment, one or more of the dummy gates 502 are formed over and in contact with the undoped portion 404*a* of the fin 404, and one or more other of the dummy gates 502 are patterned adjacent to, and in contact with, the doped portion 404*b* of the fin 404. It is this/these other dummy gate(s) 502 which will be shunted to the diffusion contacts.

Next, a filler layer (e.g., filler layer 602, see FIG. 6—described below) is deposited around the dummy gates 502. The filler layer 602 can be formed from any suitable filler material, including but not limited to, a dielectric such as silicon dioxide ($SiO_2$). According to an exemplary embodiment, the filler layer 602 is deposited around the dummy gates 502 using a high-density plasma (HDP). Chemical-mechanical polishing (CMP) is then used to planarize the filler material using the dummy gates as an etch stop.

Figure 6:
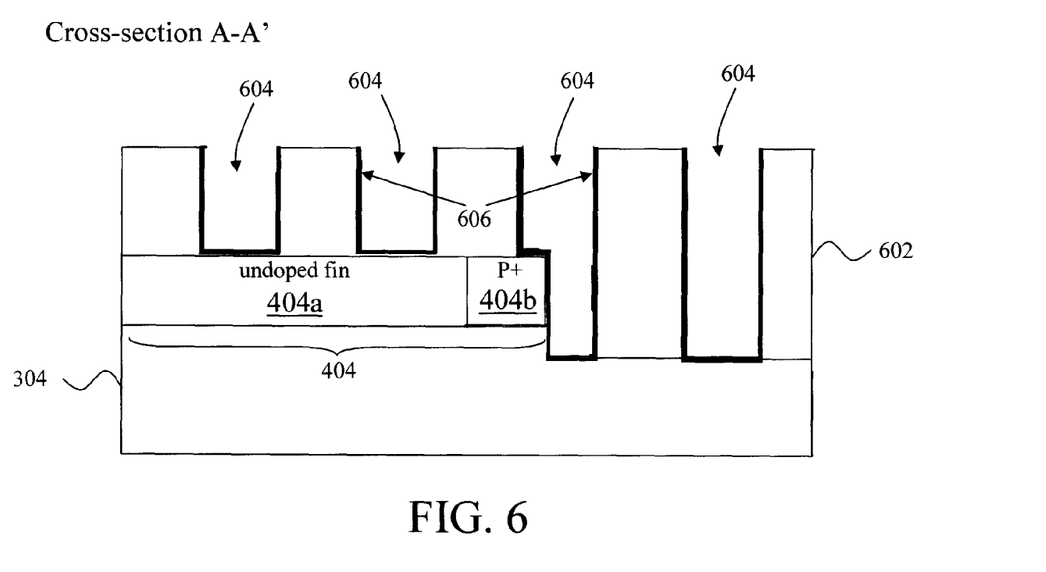
FIG. 6 is cross-sectional diagram illustrating removal of the dummy gates selective to a filler layer around the dummy gates, resulting in trenches having been formed in the filler layer, and a conformal gate dielectric having been deposited into the trenches according to an embodiment of the present invention.

The dummy gate(s) 502 are then removed selective to the filler layer 602, resulting in trenches 604 being formed in the filler layer 602. See FIG. 6. The dummy gates 502 can be removed selective to the filler layer 602 using wet chemical etching or dry etching. The trenches 604 reflect the negative footprint of the dummy gates 502 after the dummy gate removal. Thus, one or more of the trenches 604 extend through the filler layer 602 down to the undoped portion 404*a* of the fin 404, and one or more of the trenches 604 extend through the filler layer 602 down to/adjacent to the doped portion 404*b* of the fin 404. As shown in FIG. 6, the trench 604 adjacent to the doped portion 404*b* of the fin 404 exposes that doped portion 404*b* in order to permit direct shunting to the gate which will be formed in that trench. While it is shown in FIG. 6 that the trench 604 for the shunted gate wraps around the end (of the doped portion 404*b*) of the fin 404, this configuration is not necessary. All that is required is for the shunted gate to touch (physically contact) the doped portion 404*b* of the fin 404. Thus, the fin could in fact continue on to the other side of the trench/gate. In that case, however, care must be taken to prevent (unintentional) shorting of the fin to an adjacent gate—see below. Thus, tucking the end of the fin under the gate as shown in the figures can be an effective way to prevent shorting the fin.

As shown in FIG. 6, a conformal gate dielectric 606 is then deposited into the trenches 604, i.e., so as to line a bottom and sidewalls of each of the trenches 604. Any conformal deposition process, such as chemical vapor deposition (CVD) or atomic layer deposition (ALD) may be employed to deposit the gate dielectric. As provided above, according to an exemplary embodiment, the process is a replacement metal gate process or RMG. In that case, the gate dielectric 606 is preferably a high-κ dielectric material, such as hafnium oxide or lanthanum oxide. As is known in the art, a high-κ dielectric is a material having a dielectric constant κ that is greater than the dielectric constant of silicon dioxide. Alternatively, for polysilicon gates, oxides such as silicon oxide may be employed for the gate dielectric 606. An oxide gate dielectric material may be deposited (e.g., using one of the above conformal deposition processes) or grown using, e.g., a thermal oxidation process to form a thermal oxide. Optionally, gate dielectric material that is deposited/grown on the top surface of the filler layer 602 can be removed using, e.g., CMP, leaving only gate dielectric present lining the (bottom and sidewalls of each of the) trenches. See FIG. 6.

Figure 7:
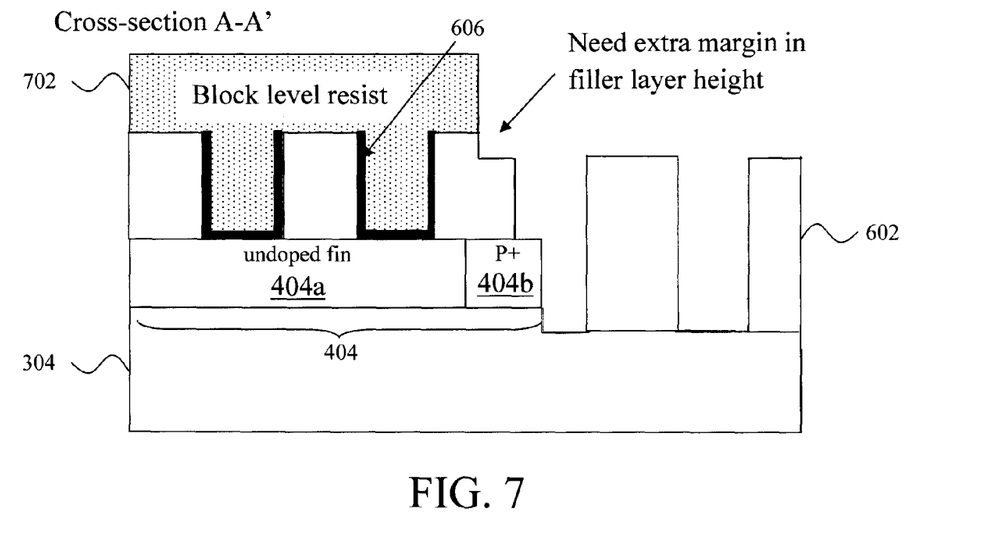
FIG. 7 is cross-sectional diagram illustrating a block level resist having been formed which masks one or more of the trenches and leaving one or more other of the trenches unmasked, and the gate dielectric having been selectively removed from the unmasked trenches according to an embodiment of the present invention.

Next, in order to be able to provide continuity between one of the (replacement) gates and one of the diffusion contacts of the device, the gate dielectric 606 is selectively removed from one or more of the trenches 604. See FIG. 7. By way of example only, as shown in FIG. 7, the gate dielectric 606 is selectively removed from the two rightmost trenches 604, one of which is the trench adjacent to the doped portion 404*b* of the fin 404. The goal here is to have gate dielectric separating the respective (replacement) gate(s) from the undoped portion(s) 404*a* of the fins 404 and to have no gate dielectric between the respective (replacement) gate(s) and the doped portion(s) 404*b* of the fins 404 to which those gates are directly shunted. This may be accomplished using the above-described selective dielectric formation (i.e., deposition and selective removal) process. It is notable that in this example there is a trench (the rightmost trench depicted in FIG. 7) that is surrounded (bottom and sidewalls) with insulator (i.e., BOX 308/filler layer 602). For process simplicity, the dielectric can be removed from this trench as well, since it is not needed. However, it is possible to selectively remove the gate dielectric from only those trenches in which a shunted gate will be formed.

According to an exemplary embodiment, this selective removal of the gate dielectric 606 is achieved by first forming a block level resist 702 on the wafer, i.e., on the filler layer 602 and filling one or more of the trenches 604. As shown in FIG. 7, the block level resist 702 will be used (to fill and) to mask those trenches 604 in which the gate dielectric 606 will remain. Conversely, the gate dielectric will be removed from those trenches not covered/masked by the block level resist 702. Any suitable resist material (e.g., polymer, polymer precursors, etc.) may be used for block level resist 702 and may be processed using standard patterning techniques.

It is notable that, as shown in FIG. 7, an extra margin in the height of the filler layer 602 is needed to account for (filler layer) material lost during the block level resist 702 etch. Namely, in order to form the block level resist 702, according to an exemplary embodiment, the resist material is first blanket deposited onto the wafer, overfilling each of the trenches 604 and covering the gate dielectric 606. An anisotropic etch (such as reactive ion etching (RIE)) can then be used to pattern the resist material (into block level resist 702), and thereby remove the resist from those trenches from which the gate dielectric 606 will also be removed. Since the goal is complete removal of the gate dielectric 606 from those (unmasked) trenches and since the resist material is covering the gate dielectric 606 in those trenches, the resist material is preferably completely removed from those trenches (from which the gate dielectric will be removed). Based on the selectivity of the etch chemistry, use of a directional etch (such as RIE) will likely to some degree affect horizontal surfaces, including the top (unmasked) surfaces of the filler layer 602. Thus, in order to fully remove the resist material and thus fully expose the gate dielectric in the desired trenches, a portion of the filler layer 602 proximal to these trenches might be etched. This is shown in FIG. 7.

With the patterned block level resist 702 in place, the gate dielectric 606 may then be (selectively) removed from the unmasked trenches. By way of example only, the gate dielectric 606 may be removed using a dry or wet etching process. Following the (selective) removal of the gate dielectric 606, any of the block level resist 702 remaining after the dielectric etch may then also be removed (e.g., using a resist chemical stripper).

Following the selective removal of the gate dielectric 606 and the block level resist 702, the result is that one or more of the trenches 604 being lined (i.e., bottom and sidewalls) with the gate dielectric 606 and one or more other of the trenches 604 having no gate dielectric present therein. As described above, the selective removal of the gate dielectric from one or more of the trenches permits the respective gates (to be formed in those trenches—as described below) to be directly shunted (via the doped portion(s) 404*b* of the fins 404) to a diffusion line. Hence, removal of the gate dielectric from these trenches is needed. Accordingly, in the exemplary embodiment shown illustrated in FIG. 7, the gate dielectric is removed from at least the trench(es) that is/are adjacent to the doped portion(s) 404*b* of the fins 404 such that the gate to be formed in that/those trench(es) can be directly shunted to the doped portion(s) 404*b* of the fins 404. Conversely, the gate dielectric remains in the trench(es) that are present over the undoped portion(s) 404*a* of the fins 404 so as to serve as a gate dielectric between the gates to be formed in that/those trenches and the fins.

Next, to complete the replacement gate process, a suitable gate material is then deposited into and filling the trenches 604 to form (replacement) gates 802 of the device. See FIG. 8. In the trenches from which the gate dielectric was removed, the gate material will form a shunted gate to the doped portion(s) 404*b* of the fins 404. In the trenches where the gate dielectric remains, the gate material will be deposited onto the gate dielectric, and thus will be separated from the undoped portion(s) 404*a* of the fins 404 by the gate dielectric.

Any suitable gate material may be employed, including but not limited to, a metal(s), doped polysilicon, etc. According to an exemplary embodiment, the above-described process is a replacement metal gate (RMG) process, and thus the (replacement) gate material is a metal or metals. Suitable gate metals include but are not limited to, cobalt, nickel, platinum and/or alloys thereof such as nickel-platinum.

Figure 9:
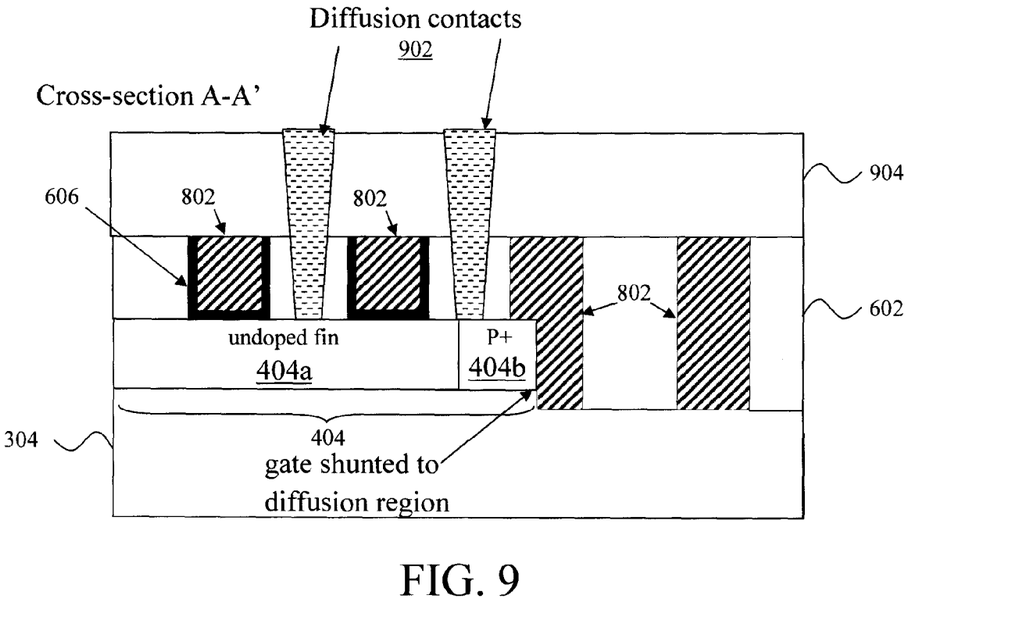
FIG. 9 is a cross-sectional diagram illustrating diffusion contacts having been formed to the fins according to an embodiment of the present invention.

The gate material can be deposited into the trenches using a suitable standard deposition process so as to overfill the trenches. Excess gate material can then be removed using, e.g., CMP (which provides a planar surface for further processing—see, e.g., FIG. 9, described below). As shown in FIG. 8, the result is at least one of the replacement gates 802 being directly shunted to (i.e., in direct contact with) the doped portion(s) 404*b* of the fins 404, and one or more other of the replacement gates being separated from the undoped portion(s) of the fins 404 by the gate dielectric.

While the shunted gate(s) in the example depicted is/are shown to wrap around the end (of the doped portion 404*b*) of the fin 404 (see, e.g., FIG. 8) this configuration is not necessary. All that is required is for the shunted gate to touch (physically contact) the doped portion 404*b* of the fin 404. Thus, the fin could in fact continue on to the other side of the gate. However, an advantage to tucking the end of a fin under the gate (i.e., having the gate wrap around the end of the fin as shown in the figures) is that this configuration prevents the fin from (unintentionally) shorting to an adjacent gate. For instance, if the doped portion 404*b* of the fin 404 were instead to pass under and continued on to the other side of the shunted gate, then care would be needed to prevent shorting of the fin 404 to the adjacent gate (i.e., to the rightmost gate depicted in FIG. 8).

Next, diffusion contacts to the (doped and/or undoped portions of) the fin 404 are formed. See FIG. 9. In the example shown in FIG. 9 diffusion contacts 902 are formed to both the undoped portion 404a and the doped portion 404b of the fin 404. Diffusion contacts 902 are representative of any of the diffusion contacts 106 shown in FIG. 1 and described above. As is evident in FIG. 9, the shunted gate, via the doped region 404b of the fin 404 is directly shunted to the diffusion contact. By comparison with conventional layouts, this gate-to-diffusion contact occurs without the use of crossovers which altogether eliminates the potential for crossover shorting to adjacent gates and thus enables increased device scaling capabilities.

According to an exemplary embodiment, the diffusion contacts are formed by first depositing an insulator 904 (such as an oxide) on the filler layer 602, covering the replacement gates 802. Vias can then be patterned through the insulator 904 and filler layer 602 using standard lithography and etching techniques, and then filled with a conductive material such as a metal or metals to form the diffusion contacts 902. See FIG. 9. As described above, the doped portion 404b of the fin 404 directly shunts one or more of the diffusion contacts 902 to one more of the replacement gate 802. It is notable that while the present techniques are being depicted above in conjunction with a FINFET process flow, this is merely an example intended to illustrate the present techniques, and the same process may be implemented in the same manner as described above in conjunction with other device configurations, such as nanowire-based devices, planar complementary metal oxide (CMOS) devices, etc. By way of example only, in the case of a planar CMOS device, the fin patterning process is not employed, however the same above-described process can be employed to directly shunt one or more of the gates to a coped portion(s) of the SOI. Similarly, with a nanowire-based embodiment, nanowires rather than fins are patterned in the SOI. The remainder of the process is the same.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of fabricating a device, comprising the steps of:
    selectively implanting one or more dopants into a semiconductor wafer so as to form at least one doped region of the wafer and at least one undoped region of the wafer;
    forming fins in the wafer with at least a given one of the fins being formed both from a portion of the doped region of the wafer and from a portion of the undoped region of the wafer, such that the at least one given fin comprises both a doped portion and an undoped portion;
    forming dummy gates on the wafer, wherein one or more of the dummy gates are in contact with the undoped portion of the at least one given fin and one or more other of the dummy gates are in contact with the doped portion of the at least one given fin;
    depositing a filler layer around the dummy gates;
    removing the dummy gates selective to the filler layer forming trenches in the filler layer, wherein at least one of the trenches extends through the filler layer down to the undoped portion of the at least one given fin and at least one other of the trenches extends through the filler layer down to the doped portion of the at least one given fin;
    selectively forming a gate dielectric lining the trenches which extend through the filler layer down to the undoped portion of the at least one given fin; and
    forming replacement gates in the trenches, wherein i) the replacement gates formed in the trenches which extend through the filler layer down to the undoped portion of the at least one given fin are separated from the undoped portion of the at least one given fin by the gate dielectric and ii) the replacement gates formed in the trenches which extend through the filler layer down to the doped portion of the at least one given fin are in direct contact with the doped portion of the at least one given fin.

2. The method of claim 1, wherein the step of selectively implanting one or more dopants into the wafer comprises the steps of:
    forming a mask on the wafer such that at least one region of the wafer is masked and at least one other region of the wafer is unmasked;
    implanting the one or more dopants into the unmasked region of the wafer to form the doped region of the wafer, wherein the masked region of the wafer forms the undoped region of the wafer; and
    removing the mask.

3. The method of claim 2, wherein the mask formed on the wafer comprises a block level resist.

4. The method of claim 1, wherein the step of forming the fins in the wafer comprises the steps of:
    forming a fin hardmask on the wafer
    patterning the fins in wafer through the fin hardmask; and
    removing any portions of the fin hardmask remaining after the fins have been patterned, wherein the fin hardmask is configured such that the at least one given fin is formed in the wafer both from the portion of the doped region of the wafer and from the portion of the undoped region of the wafer.

5. The method of claim 1, wherein the dummy gates are formed from polysilicon.

6. The method of claim 1, wherein the step of selectively forming a gate dielectric lining the trenches which extend through the filler layer down to the undoped portion of the at least one given fin comprises the steps of:
    forming the gate dielectric on the wafer so as to line each of the trenches; and
    selectively removing the gate dielectric from the trenches which extend through the filler layer down to the doped portion of the at least one given fin.

7. The method of claim 6, wherein the step of selectively removing the gate dielectric from the trenches which extend through the filler layer down to the doped portion of the at least one given fin comprising the steps of:
    forming a mask on the wafer to selectively mask the trenches which extend through the filler layer down to the undoped portion of the at least one given fin leaving the trenches which extend through the filler layer down to the doped portion of the at least one given fin unmasked;
    removing the gate dielectric from the trenches which extend through the filler layer down to the doped portion of the at least one given fin which are unmasked; and
    removing the mask.

8. The method of claim 7, wherein the mask formed on the wafer comprises a block level resist.

9. The method of claim 7, wherein the gate dielectric is removed from the trenches which extend through the filler layer down to the doped portion of the at least one given fin using a dry or wet etching process.

10. The method of claim 6, wherein the gate dielectric is formed from a high-κ material, and wherein the step of forming the gate dielectric on the wafer so as to line each of the trenches comprises the step of:

depositing the gate dielectric onto the wafer using a conformal deposition process so as to line each of the trenches.

11. The method of claim 6, wherein the gate dielectric is formed from an oxide material, and wherein the step of forming the gate dielectric on the wafer so as to line each of the trenches comprises the step of:

growing the gate dielectric on the wafer using a thermal oxidation process so as to line each of the trenches.

12. The method of claim 6, wherein by way of forming the gate dielectric on the wafer so as to line each of the trenches the gate dielectric is formed on a top surface of the filler layer, the method further comprising the step of:

removing the gate dielectric from the top surface of the filler layer leaving only the gate dielectric present lining each of the trenches.

13. The method of claim 1, wherein the replacement gates comprise at least one metal.

* * * * *